(12) United States Patent
Schubert et al.

(10) Patent No.: US 9,105,701 B2
(45) Date of Patent: Aug. 11, 2015

(54) SEMICONDUCTOR DEVICES HAVING COMPACT FOOTPRINTS

(71) Applicant: Micron Technology, Inc., Boise, ID (US)

(72) Inventors: Martin F. Schubert, Boise, ID (US); Vladimir Odnoblyudov, Eagle, ID (US); Cem Basceri, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/913,968

(22) Filed: Jun. 10, 2013

(65) Prior Publication Data

US 2014/0361382 A1 Dec. 11, 2014

(51) Int. Cl.
| H01L 23/522 | (2006.01) |
| H01L 21/768 | (2006.01) |
| H01L 23/48  | (2006.01) |
| H01L 23/482 | (2006.01) |
| H01L 21/683 | (2006.01) |

(52) U.S. Cl.
CPC ........ *H01L 21/76898* (2013.01); *H01L 23/481* (2013.01); *H01L 23/4824* (2013.01); *H01L 21/6835* (2013.01); *H01L 21/6836* (2013.01); *H01L 23/522* (2013.01); *H01L 2221/6834* (2013.01); *H01L 2221/68327* (2013.01); *H01L 2225/06541* (2013.01)

(58) Field of Classification Search
CPC .................... H01L 23/481; H01L 2225/06541
USPC ............ 257/621, E21.597, E23.011, E23.174
See application file for complete search history.

(56) References Cited

U.S. PATENT DOCUMENTS

| 4,959,705 | A  | * | 9/1990  | Lemnios et al. ............... 257/532 |
| 7,906,363 | B2 | * | 3/2011  | Koyanagi ......................... 438/66 |
| 7,932,602 | B2 | * | 4/2011  | Katagiri ......................... 257/758 |
| 8,004,090 | B2 | * | 8/2011  | Uchiyama ..................... 257/774 |
| 8,164,113 | B2 | * | 4/2012  | Lin et al. ........................ 257/173 |
| 2006/0006501 | A1 | * | 1/2006  | Kawano ......................... 257/625 |
| 2009/0039471 | A1 | * | 2/2009  | Katagiri ......................... 257/620 |
| 2009/0065904 | A1 | * | 3/2009  | Wang ............................. 257/621 |
| 2009/0152602 | A1 | * | 6/2009  | Akiyama ....................... 257/288 |
| 2009/0302455 | A1 | * | 12/2009 | Chida et al. ................... 257/698 |
| 2010/0032808 | A1 | * | 2/2010  | Ding et al. .................... 257/621 |
| 2010/0164055 | A1 | * | 7/2010  | Miyakawa et al. ........... 257/508 |
| 2010/0164062 | A1 | * | 7/2010  | Wang et al. ................... 257/532 |
| 2010/0193954 | A1 | * | 8/2010  | Liu et al. ....................... 257/751 |
| 2012/0037969 | A1 | * | 2/2012  | Sanders et al. ............... 257/296 |
| 2012/0104560 | A1 | * | 5/2012  | Kawano ......................... 257/621 |
| 2012/0135566 | A1 | * | 5/2012  | Pinguet et al. ................ 438/107 |
| 2012/0199984 | A1 | * | 8/2012  | Fujita et al. ................... 257/774 |
| 2012/0248580 | A1 | * | 10/2012 | Matsugai et al. ............. 257/621 |
| 2012/0261826 | A1 | * | 10/2012 | Kuo et al. ...................... 257/774 |
| 2013/0134548 | A1 | * | 5/2013  | Torii .............................. 257/508 |
| 2013/0169355 | A1 | * | 7/2013  | Chen et al. .................... 327/564 |
| 2013/0181349 | A1 | * | 7/2013  | Koyama et al. .............. 257/741 |
| 2013/0256834 | A1 | * | 10/2013 | Tan et al. ....................... 257/532 |
| 2013/0285125 | A1 | * | 10/2013 | Chen et al. .................... 257/288 |

* cited by examiner

*Primary Examiner* — Ida M Soward
(74) *Attorney, Agent, or Firm* — Perkins Coie LLP

(57) ABSTRACT

Semiconductor devices and methods for making semiconductor devices are disclosed herein. A semiconductor device configured in accordance with a particular embodiment includes a substrate having a source/drain region, an interconnect, and first and second electrodes extending between first and second sides of the substrate. The first electrode includes a first contact pad and a via extending through the substrate that connects the first contact pad with the interconnect. The second electrode includes a second contact pad and a conductive feature in the substrate that connects the second contact pad with the interconnect.

12 Claims, 15 Drawing Sheets

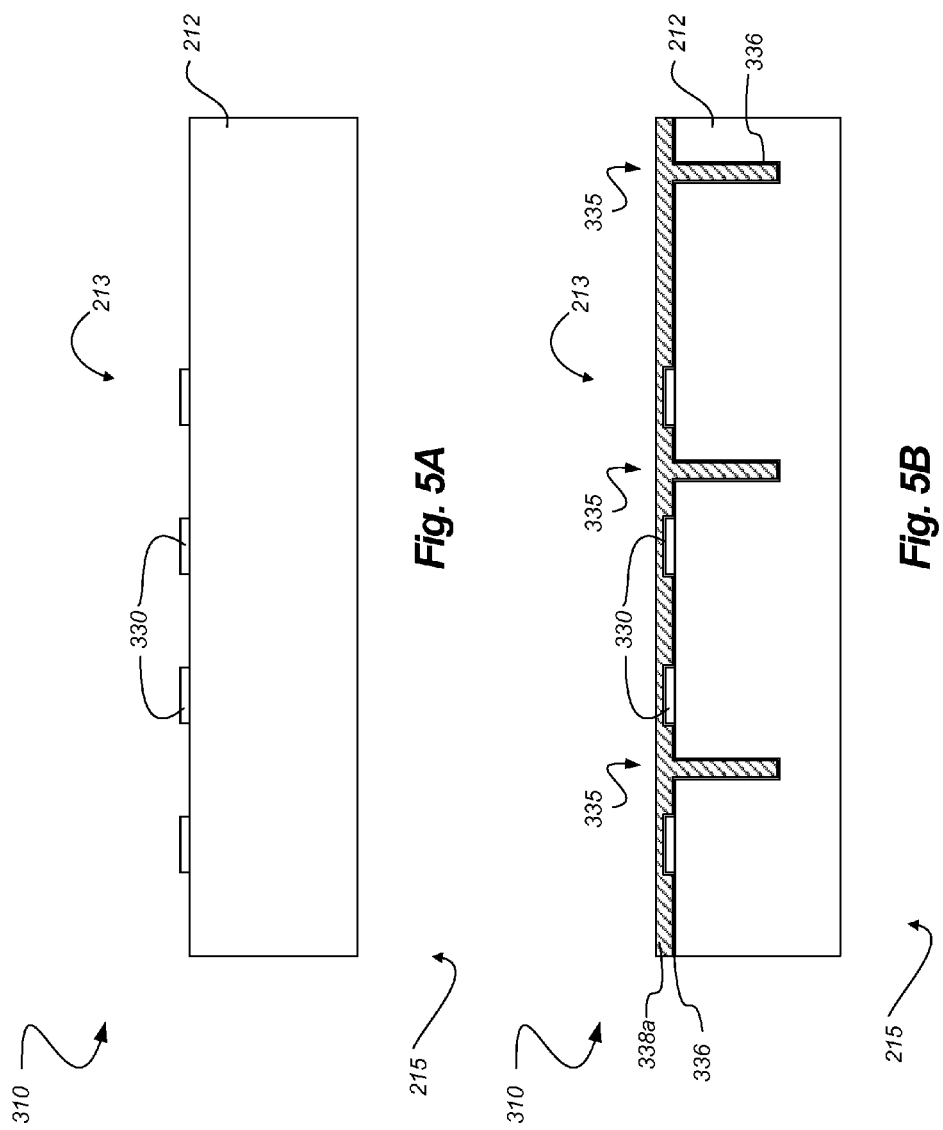

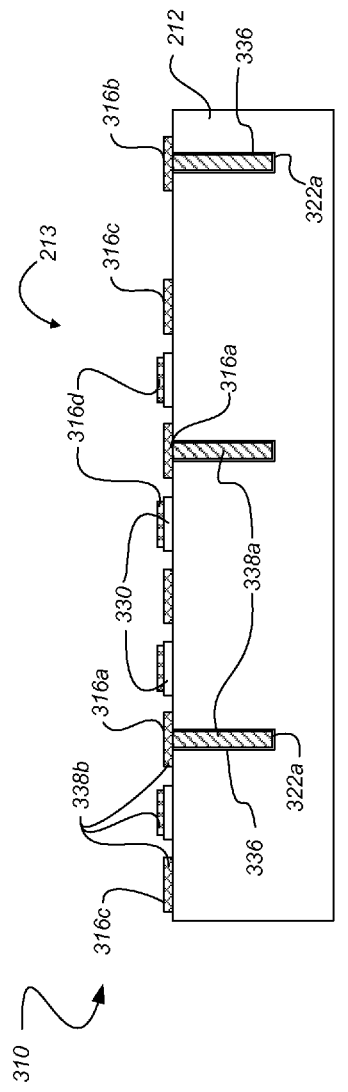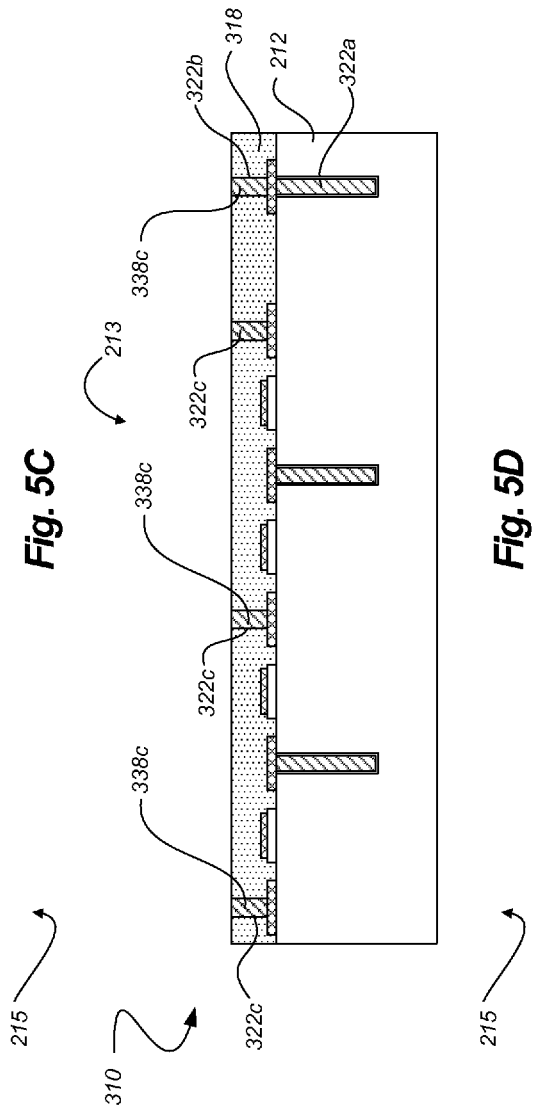

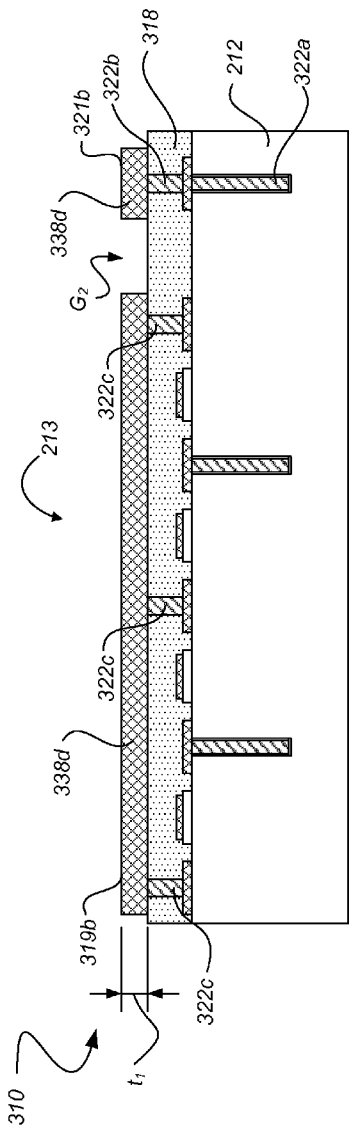
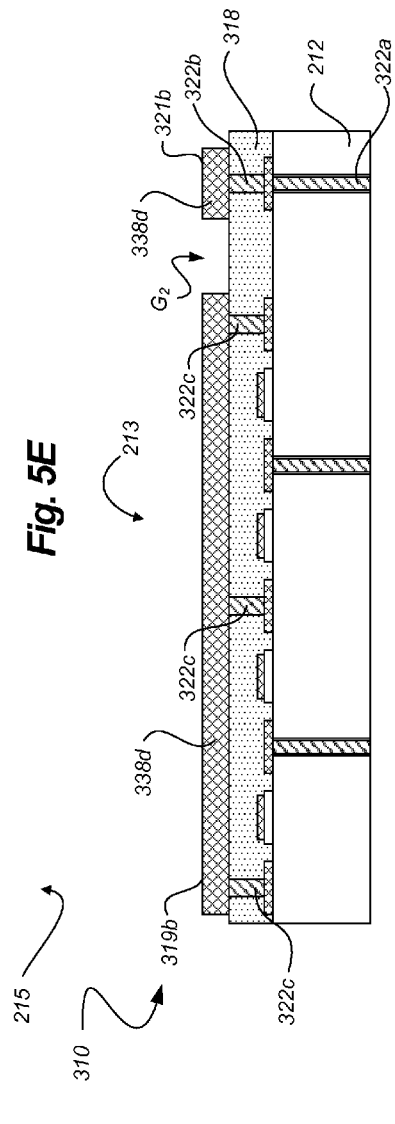
Fig. 5E
Fig. 5F

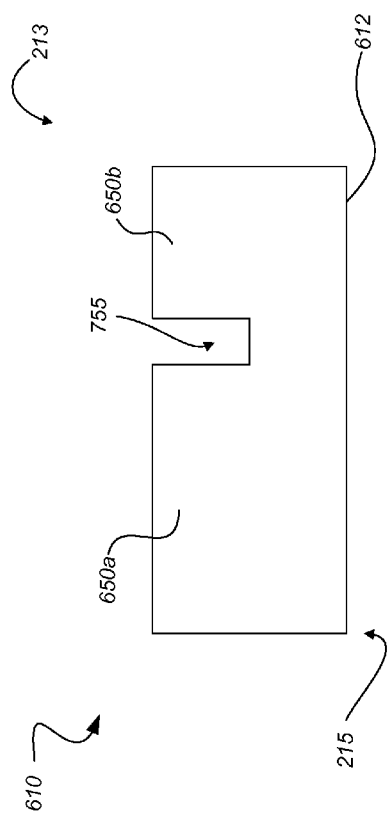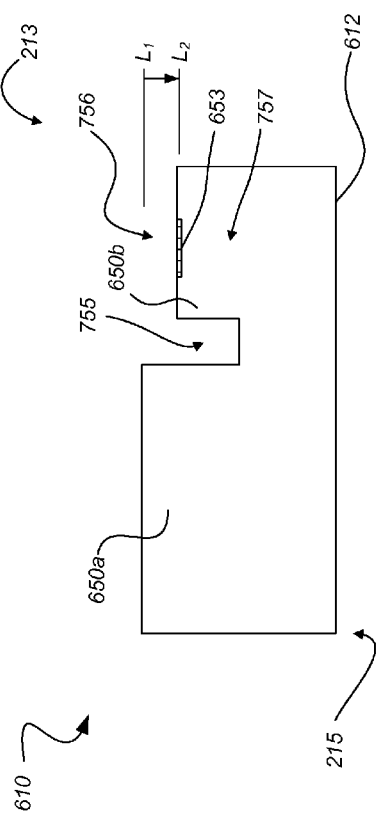

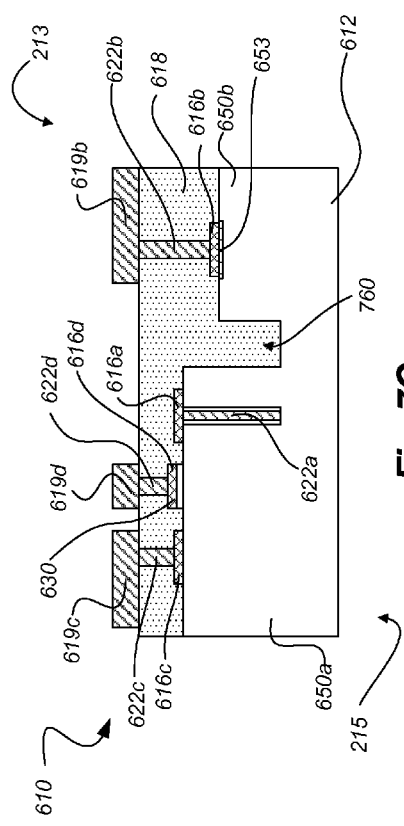
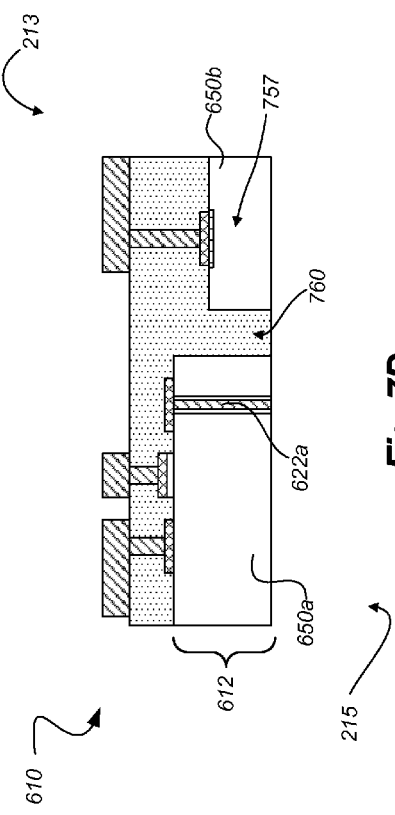

SEMICONDUCTOR DEVICES HAVING COMPACT FOOTPRINTS

TECHNICAL FIELD

The present technology is related to semiconductor devices, such as transistors, diodes, and other solid-state devices. In particular, some embodiments are related to semiconductor devices having various device features to achieve a compact footprint.

BACKGROUND

Solid-state transistors are used in a wide variety of applications. For example, solid-state power transistors provide large operating voltages (e.g., 50V) for power supplies, electric cars, and solar cells. As shown in FIG. 1, a power transistor 100 includes a semiconductor substrate 102, substrate regions 103 (drawn in broken lines), and interconnects 105 connected to the substrate regions 103. The substrate regions 103 includes a gate region 103a, a source region 103b, and a drain region 103c. The interconnects 105 include a gate interconnect 105a on the gate region 103a, a source interconnect 105b on the source region 105b, and a drain interconnect 105c on the drain region 103c. In operation, a gate signal at the gate interconnect 105a turns the power transistor 100 "on" by opening a conductive channel in the gate region 103a. When the conductive channel is open, a voltage across the source and drain interconnects 105b, 105c draws an electrical current through the conductive channel. When the power transistor 100 is "off," the gate signal closes the conductive channel so that the electrical current ceases to flow.

In general, a transistor will operate more efficiently per unit area with a small footprint (i.e., when it occupies a small surface area). Certain design constraints, however, make it difficult to reduce the footprint of a transistor. These design constraints particularly impact power transistors. Referring again to the power transistor 100, one design constraint requires the substrate regions 103 and the interconnects 105 to have a serpentine shape. The serpentine shape winds the gate region 103a around the surface of the substrate 102 to maximize the magnitude of the operating current. Another design constraint requires the interconnects 105 to be spaced apart by a minimum spacing distance $S_0$ to prevent electromigration of the interconnect materials. Because the interconnects 105 wind across the surface of the substrate 102, however, the spacing distance $S_0$ has a substantial impact on the footprint.

BRIEF DESCRIPTION OF THE DRAWINGS

FIGS. 5A-5G are partially schematic cross-sectional views illustrating the semiconductor device of FIGS. 3A-3C at selected steps in a method of manufacture in accordance with an embodiment of the present technology.

FIGS. 7A-7E are partially schematic cross-sectional views illustrating the semiconductor device of FIG. 6 at selected steps in a method of manufacture in accordance with an embodiment of the present technology.

DETAILED DESCRIPTION

Specific details of several embodiments of the present technology relate to semiconductor devices having various device features for achieving a compact footprint. The term "semiconductor device" generally refers to a solid-state device that includes semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. Also, unless the context indicates otherwise, structures disclosed herein can be formed using conventional semiconductor-manufacturing techniques. Materials can be removed, for example, using plasma etching, wet etching, chemical-mechanical planarization ("CMP"), or other suitable techniques. Similarly, materials can be deposited, for example, using chemical vapor deposition, physical vapor deposition, atomic material deposition, spin coating, and/or other suitable techniques. Also, materials can be patterned, for example, by adding and/or removing materials using one or more mask materials, such as photoresist materials, hard-mask materials, or other suitable materials.

Figure 2:
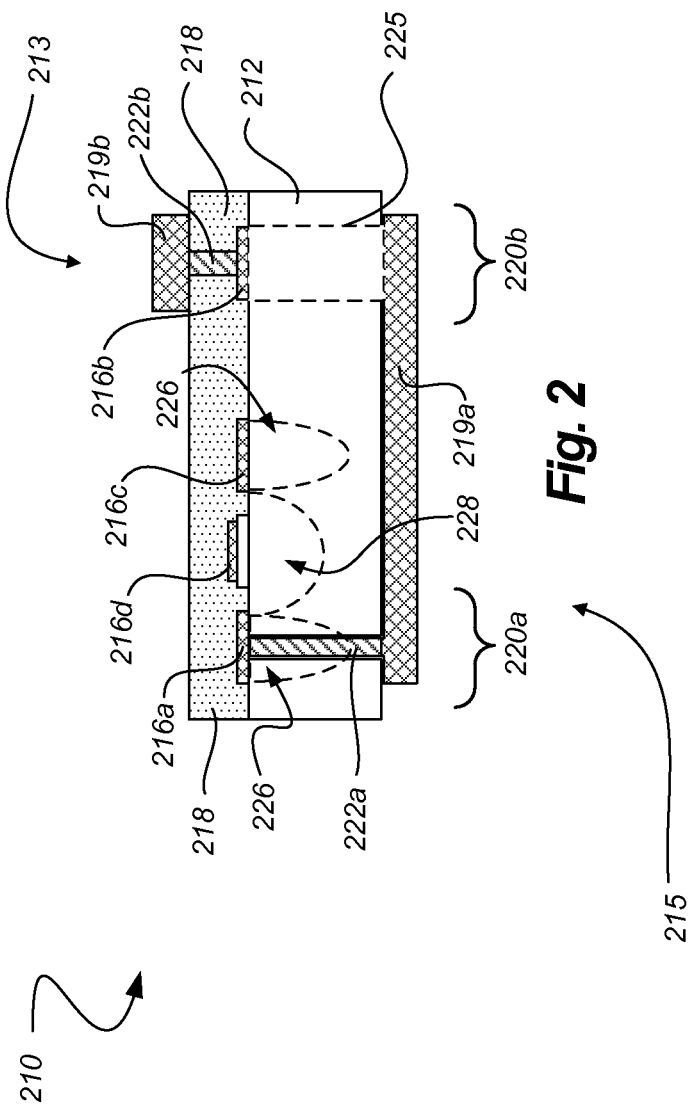
FIG. 2 is a cross-sectional side view of a semiconductor device configured in accordance with an embodiment of the present technology.

FIG. 2 is a cross-sectional side view of a semiconductor device 210 configured in accordance with an embodiment of the present technology. The semiconductor device 210 includes a substrate 212 having a first side 213 (e.g., a front side), a second side 215 (e.g., a backside), a dielectric material 218 on the substrate 212, first and second interconnects 219a and 219b at opposite sides of the substrate 212, and first and second electrodes 220a and 220b extending between the first and second sides 213, 215. The interconnects 219 can includes traces, signal lines, or other suitable conductive features for electrically interconnecting portions of the semiconductor device 210. The interconnects 219 can also be connected to features that electrically connect the semiconductor device 210 to other devices and/or components, such as a redistribution network, wirebonds, etc. (not shown). In some embodiments described in greater detail below, one or more of the interconnects 219 can include conductive plate structures for distributing an operating current throughout the semiconductor device 210.

The first electrode 220a includes a first contact pad 216a and a first via 222a that extends through the substrate 212 to connect the first contact pad 216a with the first interconnect 219a. The second electrode 220b includes a second contact pad 216b, a second via 222b extending through the dielectric material 218, and a conductive feature 225 (shown schematically) in the substrate 212 to connect the second contact pad 216b with the second interconnect 219b. In one embodiment, the conductive feature 225 includes a through-substrate via (described in greater detail below with reference to FIGS. 3A-5G). In another embodiment, the conductive feature 225 includes a diode (described in greater detail below with reference to FIGS. 6-7E).

In the illustrated embodiment, the semiconductor device 210 includes a field-effect transistor (FET), such as a metal oxide semiconductor (MOS) transistor, a high electron mobility transistor (HEMT), or other suitable field-effect device. Accordingly, the semiconductor device 210 can have terminals (e.g., electrodes, contact pads, vias, electrodes, etc.) connected to one or more source/drain regions 226 and one or more gate regions 228. As shown, the source/drain regions 226 are in the vicinity of the first contact pad 216a and a third contact pad 216c, and the gate region 228 is in the vicinity of a gate contact pad 216d. In other embodiments, however, the semiconductor device 210 can include another type of device in addition to or in lieu of a transistor (e.g., a bipolar junction transistor (BJT), a capacitor, a diode, etc.).

Figure 3A:
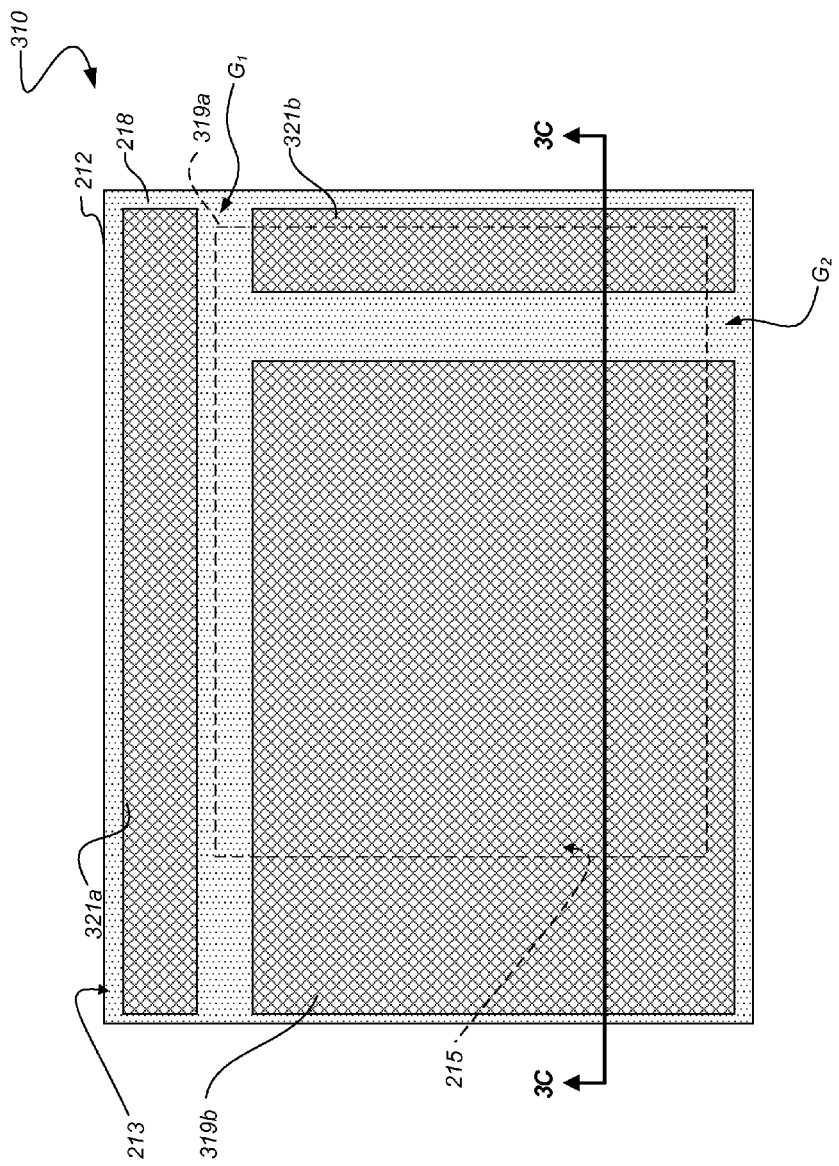
FIGS. 3A-3C are partially schematic top-plan and cross-sectional views of a semiconductor device configured in accordance with another embodiment of the present technology.
Figure 3B:
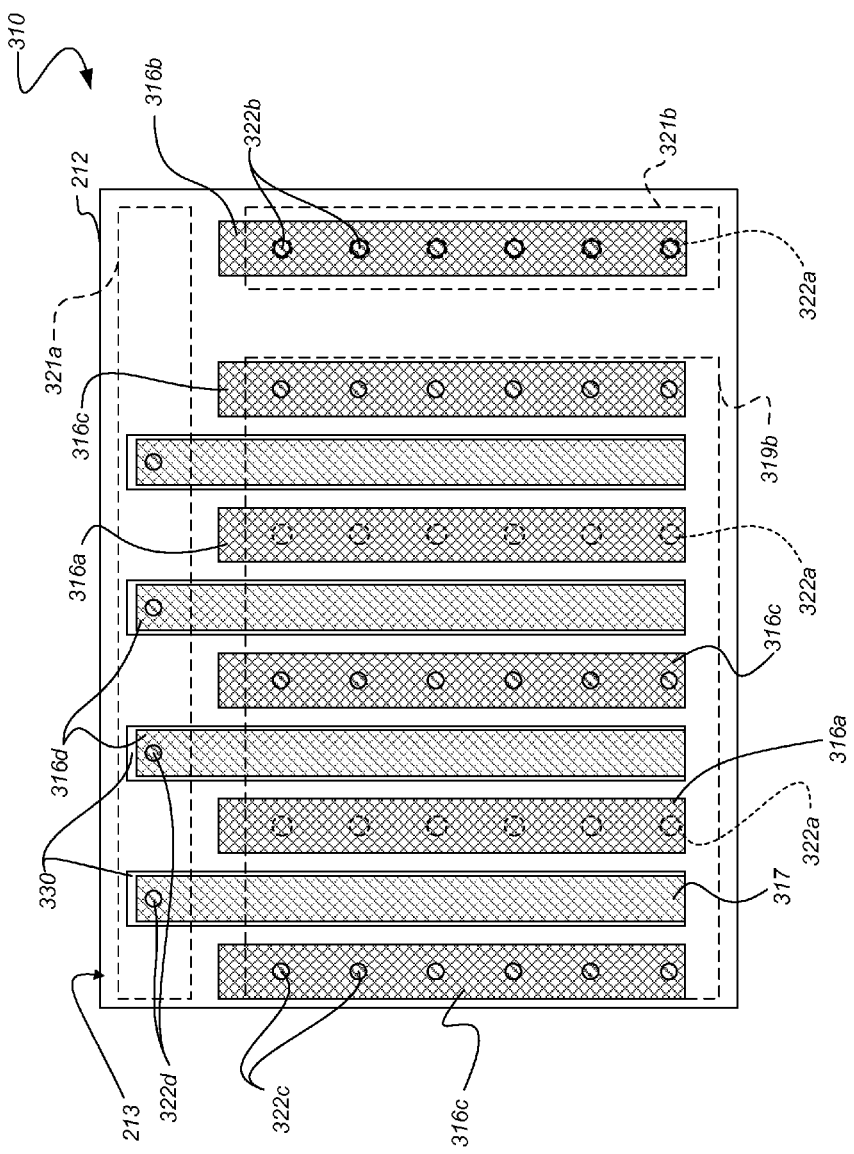
Figure 3C:
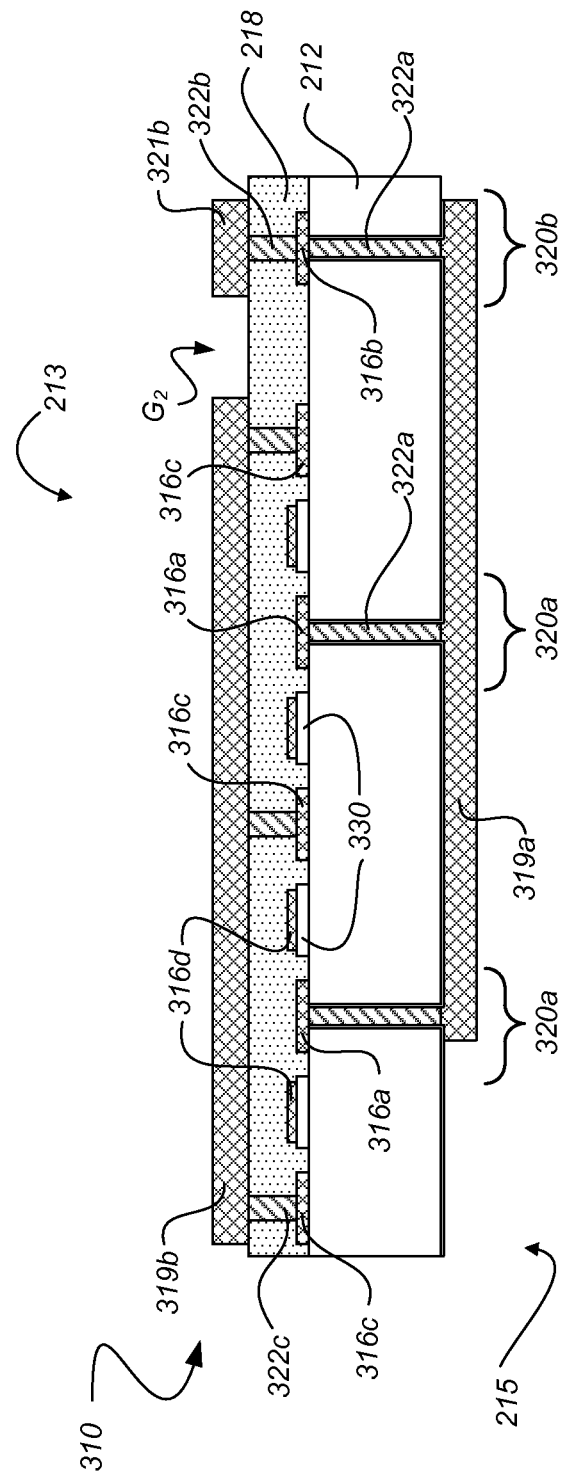

FIGS. 3A-3C are partially schematic top-plan and cross-sectional views of a semiconductor device 310 configured in accordance with an embodiment of the present technology. Referring first to FIG. 3A, the semiconductor device 310 includes the substrate 212, the dielectric material 218, first and second conductive plates 319a and 319b, and first and second interconnects 321a and 321b. The second conductive plate 319b and the interconnects 321 are on the dielectric material 218 at the first side 213. The first conductive plate 319a (drawn in broken lines) is at the second side 215 of the substrate 212 (see FIG. 2 for clarity). As shown, a first gap $G_1$ spaces the first interconnect 321a apart from the second interconnect 321b, the first gap $G_1$ also spaces the first interconnect 321a apart from the second conductive plate 319b, and a second gap $G_2$ spaces the second interconnect 321b apart from the second conductive plate 319b. In the illustrated embodiment, the interconnects 321 are conductive features that occupy a smaller surface area compared to the conductive plates 319. In other embodiments, however, one or both of the interconnects 321 can have a similar size as the conductive plates 319. As described in greater detail below, the size of the gaps G1, the size of the conductive plates 319, and/or the size of the interconnects 321 can be selected based on the magnitude of the operating current of the semiconductor device 310 (e.g., to prevent electromigration).

FIG. 3B shows the same top-plan view of FIG. 3A, but with the dielectric material 218 removed for purposes of illustration. FIG. 3B also shows the second conductive plate 319b and the interconnects 321 in broken lines. As shown in this view, the semiconductor device 310 further includes gate elements 330 on the substrate 212, first through third elongated contact pads (or contact strips) 316a-316c on the substrate 212, and elongated gate contact pads (or strips) 316d on the gate elements 330. The semiconductor device 310 further includes first (through-substrate) vias 322a (drawn in broken lines) contacting the first and second contact pads 316a and 316b, second vias 322b contacting the second contact pad 316b, third vias 322c contacting the third contact pads 316c, and fourth vias 322d contacting the gate contact pads 316d.

FIG. 3C shows a partially schematic cross-sectional view of the semiconductor device 310 taken along the line 3C-3C of FIG. 3A. As shown, the semiconductor device 310 includes individual first electrodes 320a and individual second electrodes 320b (not all of the electrodes 320 are visible in FIG. 3C). The individual first electrodes 320a include one of the first contact pads 316a and one of the first vias 322a. The individual second electrodes 320b include the second contact pad 316b, one of the first vias 322a, and one of the second vias 322b.

Figure 1:
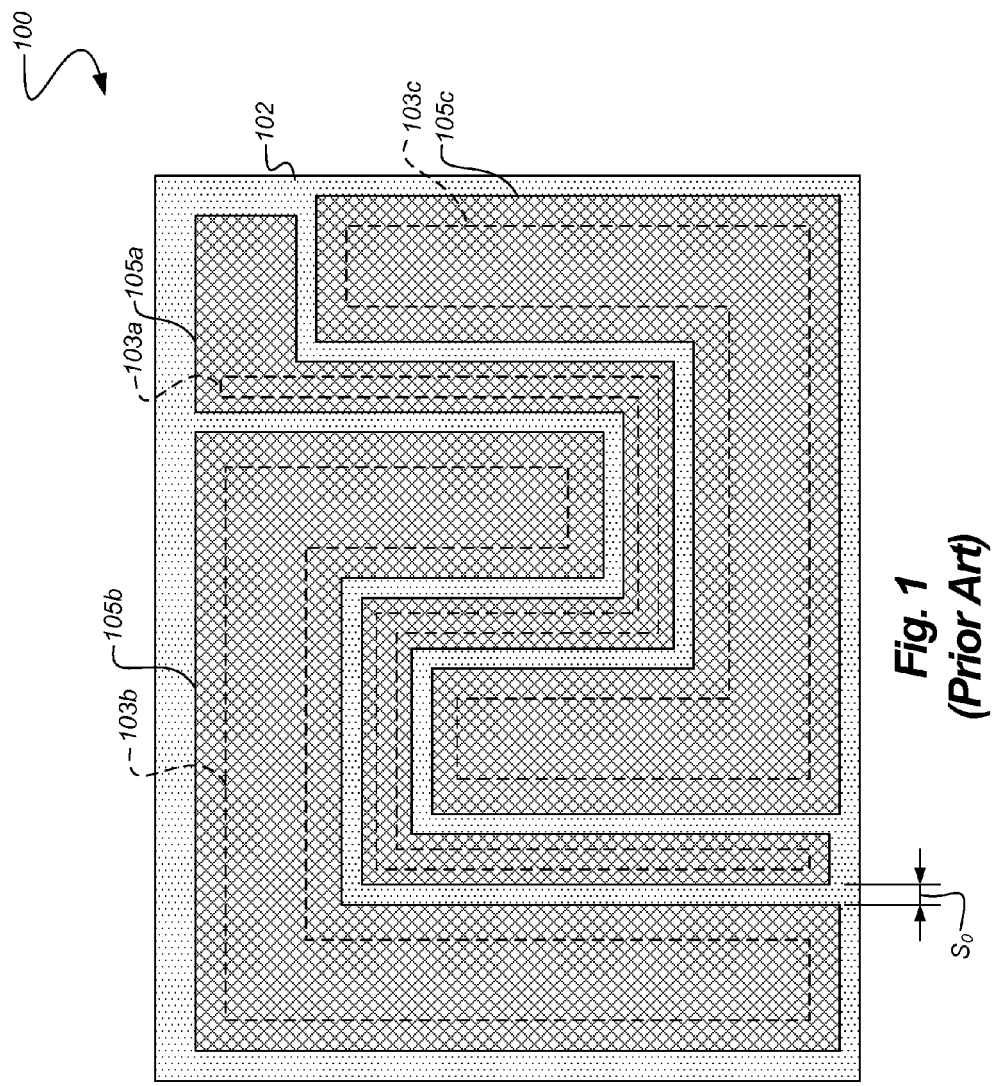
FIG. 1 is a partially schematic top-plan view of a power transistor configured in accordance with an embodiment of the prior art.
Figure 4:
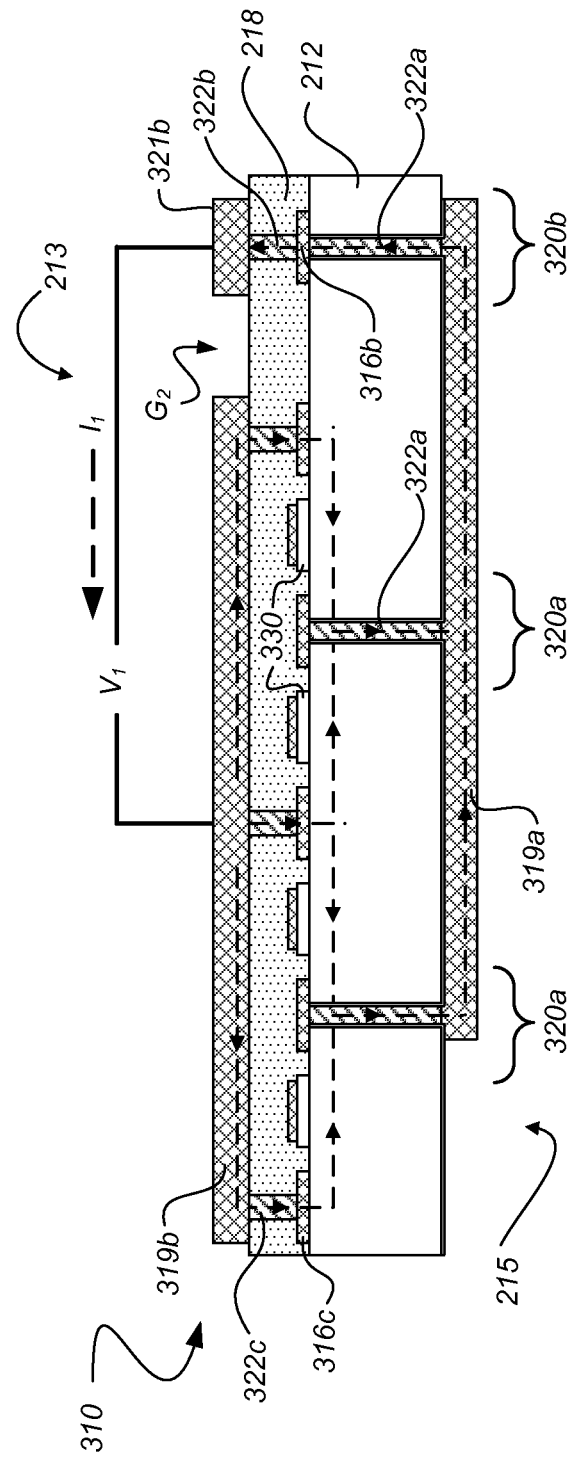
FIG. 4 is a partially schematic cross-sectional view showing the operation of the semiconductor device of FIGS. 3A-3C in accordance with an embodiment of the present technology.

FIG. 4 is a partially schematic cross-sectional view illustrating operation of the semiconductor device 310 in accordance with an embodiment of the present disclosure. When the semiconductor device is "on," a supply voltage $V_1$ applied across the second conductive plate 319b and the second interconnect 321b draws an electrical current $I_1$. As shown, portions of the electrical current $I_1$ flow through the conductive plates 319 and through the electrodes 320. One feature of the conductive plates 319 and the electrodes 320 is that they uniformly distribute the electrical current $I_1$ both laterally and vertically throughout the semiconductor device 310. As a result, the semiconductor device 310 can operate at larger current magnitudes (e.g., as a power transistor), but smaller current densities than conventional transistors. Another advantage is that the gaps $G_1$, $G_2$ prevent the electromigration of conductive materials, but do not substantially impact device footprint. By contrast, the interconnect spacing distance in conventional transistors (e.g., the power transistor 100 of FIG. 1) has a substantial impact on footprint. Related to this advantage, the semiconductor device 310 can operate more efficiently per unit area (i.e., gate length per unit area). In particular, the gate elements 330 of the semiconductor device 310 can occupy a substantial amount of surface area at the first side 213 without impacting device footprint. This is due in part to the gate elements 330 extending between the second conductive plates 319b and the substrate 212.

Figure 5G:
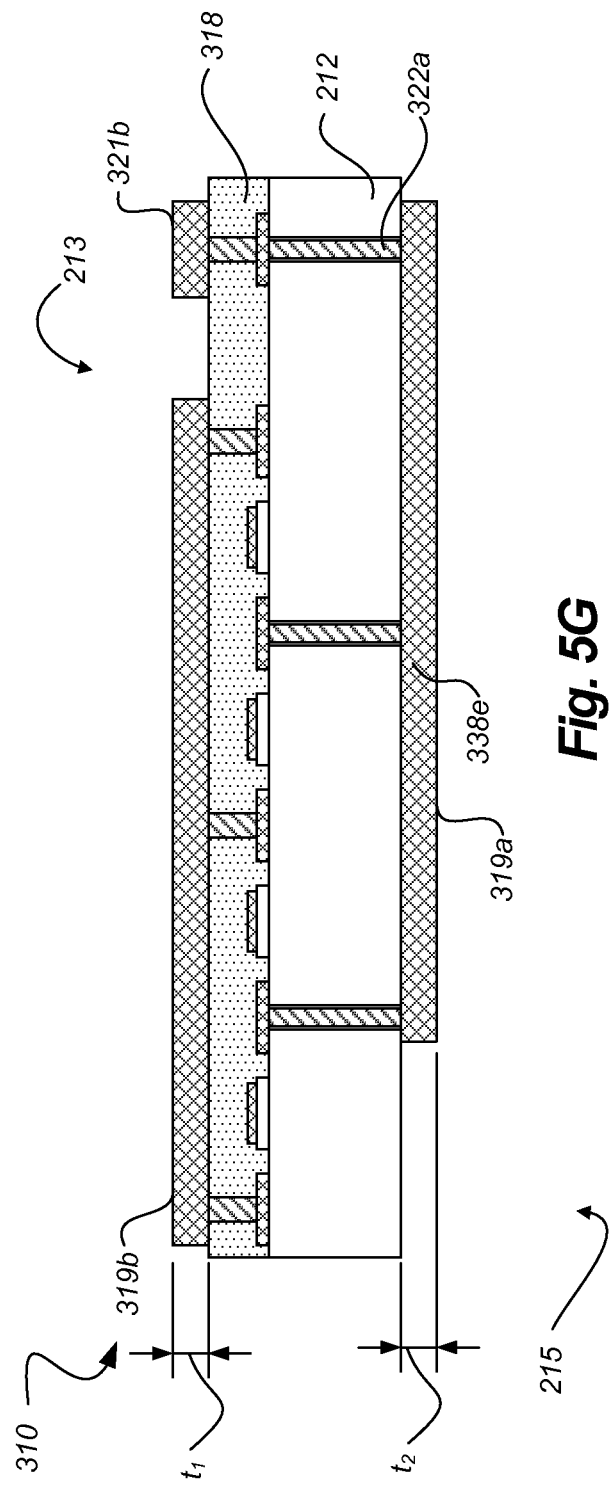

FIGS. 5A-5G are cross-sectional views illustrating a method of forming the semiconductor device 310 in accordance with selected embodiments of the present technology. FIG. 5A shows the semiconductor device 310 after forming the gate elements 330 on the substrate 212. The individual gate elements 330 can include, for example, oxide materials, semiconductor materials, or combinations of such materials. The substrate 212 can include, for example, Gallium Nitride (GaN), Aluminum Gallium Nitride (AlGaN), Gallium Arsenide (GaAs), Aluminum Gallium Arsenide (AlGaAs), or other compound or non-compound semiconductor materials. In some embodiments, the substrate 212 may include an epitaxial substrate (e.g., silicon, sapphire, silicon carbide, silicon on polyaluminum nitride, etc.) and one or more epitaxially grown or deposited materials. Although not shown for purposes of clarity, the substrate 212 can also include features or regions defined before the stage of FIG. 5A. For example, the substrate 212 can include doped, etched, and/or chemically treated regions, to define PN junctions, heterojunctions, Ohmic contact pad regions, etc.

FIG. 5B shows the semiconductor device 310 after forming openings 335 in the substrate 212, depositing a dielectric liner 336 in the openings 335 and on the substrate 212, and depositing a first conductive via material 338a on the dielectric liner 336. Suitable conductive via materials in the various embodiments of the present technology can include, for example, copper (Cu), silver (Ag), gold (Au), gold-tin (AuSn), aluminum (Al), tungsten (W), stainless steel, other suitable metals metal alloys, or other base metals with suitable final metals for final bonding and electrical connection. Suitable conductive materials can also include other electrically conductive, but non-metallic materials (e.g., SiC). Further, conductive materials can include barrier and/or seed materials.

FIG. 5C shows the semiconductor device 310 after forming the first vias 322a with the first conductive via material 338a and the contact pads 316 with a conductive contact material 338b. One or more etch, planarization, or other suitable processes can remove portions of the dielectric liner 336 and portions of the first conductive via material 338a to define the first vias 322a. Similar processes can remove portions of the conductive contact material 338b to define the contact pads 316. In some embodiments, the conductive contact material 338b can be omitted and the first conductive via material 338a can be patterned to form both the first vias 322a and the contact pads 316.

FIG. 5D shows the semiconductor device 310 after depositing the dielectric material 318 and after forming the second vias 322b, the third vias 322c, and the fourth vias 322d (FIG. 3B). The second through fourth vias 322b-322d can be formed, for example, by forming openings in the dielectric material 318, depositing a second conductive via material 338c in the openings, and removing portions of the second conductive via material 338c located on the outer surface of the dielectric material outside of the openings.

FIG. 5E shows the semiconductor device 310 after forming the second conductive plate 319b, the first interconnect 321a (FIG. 3B), and the second interconnect 321b. A first interconnect material 338d can be deposited and patterned to define the second conductive plate 319b, the interconnects 321, the first gap $G_1$ (FIG. 3B), and the second gap $G_2$. In various embodiments, the first interconnect material 338d can have a thickness $t_1$ configured so that the second conductive plate 319b and the second interconnect 321b can carry a large electrical current during operation and/or to provide mechanical support to the semiconductor device during manufacturing.

FIG. 5F shows the semiconductor device 310 after removing material at the second side 215 to expose portions of the first vias 322a. In one embodiment, the thickness t1 of the first interconnect material 338d (FIG. 5E) is selected to provide mechanical support to the semiconductor device 310 during the material removal process. In another embodiment, a support structure (not shown), such as another substrate, a die attach tape, or other suitable structure, can provide mechanical support.

FIG. 5G shows the semiconductor device 310 after forming the first conductive plate 319a at the second side 215. In the illustrated embodiment, a second interconnect material 338e is deposited and patterned to defined the first conductive plate 319a. In other embodiments, however, the second interconnect material 338e is not patterned at the stage of FIG. 5G. In one such embodiment, the first conductive plate 319a can be defined at a die singulation stage. For example, a dicing saw can simultaneously cut the second interconnect 338e and the substrate 212 to define the first conductive plate 319a. Similar to the first interconnect material 338d, the second interconnect material 338e can have a thickness $t_2$ configured so that the first conductive plate 319a can carry a large electrical current during operation.

Figure 6:
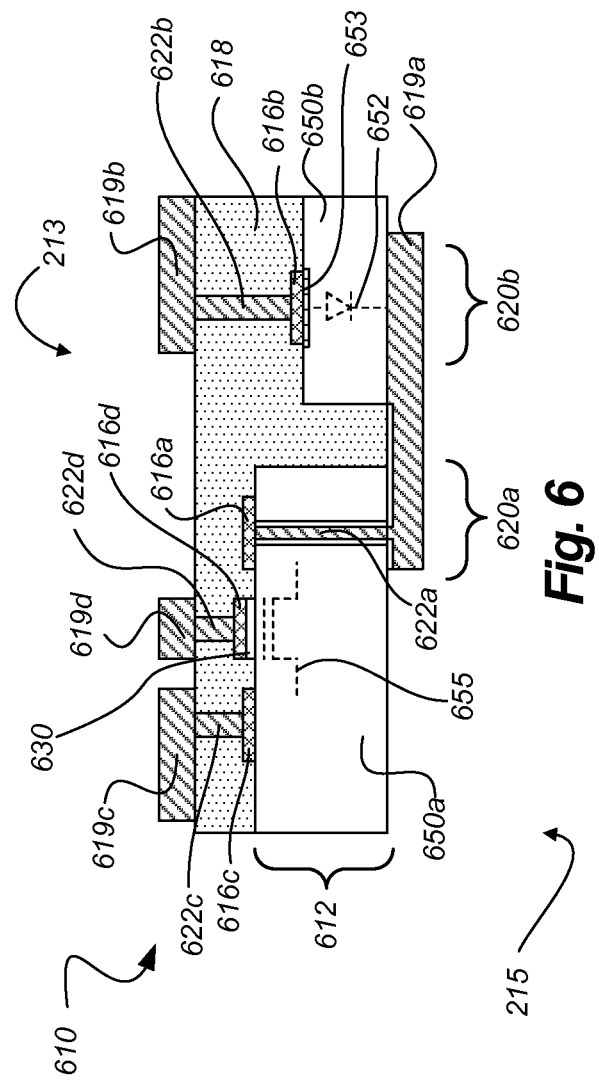
FIG. 6 is a partially schematic cross-sectional view of a semiconductor device configured in accordance with yet another embodiment of the present technology.

FIG. 6 is a cross-sectional view of a semiconductor device 610 configured in accordance with another embodiment of the present technology. The semiconductor device 610 includes a substrate 612, a dielectric material 618, first through fourth contact pads 616a-616d, first through fourth interconnects 619a-619d, first through fourth vias 622a-622d, and at least one gate element 630. The substrate 612 includes a first substrate region 650a and a second substrate region 650b mechanically separated from the first substrate region 650a by a portion of the dielectric material 618. At the first substrate region 650a, a first electrode 620a includes the first contact pad 616a and the first via 622a. At the second substrate region 650b, a second electrode 620b includes the second via 622b, the second contact pad 616b, and a vertical diode 652 (shown schematically). The vertical diode 652 can include one terminal in contact with the second contact pad 616b and a second terminal in contact with the first interconnect 619a. In the illustrated embodiment, the vertical diode 652 is a Schottky diode that includes a metal/semiconductor junction 653 between the second contact pad 616b and the second substrate region 650b. For example, the metal/semiconductor junction 653 can include a Schottky barrier defined by a silicide and/or a low- or un-doped (i.e., non-Ohmic) portion of the second substrate region 660b. In other embodiments, however, the vertical diode 652 can include another type of diode having, e.g., a P/N junction in the second substrate region 650b.

The semiconductor device 610 further includes a transistor 655 (shown schematically) having a terminal connected to the vertical diode 652 by the first interconnect 619a. One feature of the vertical diode 652 is that it makes the semiconductor device 610 more compact than conventional transistor/diode configurations. Another advantage is that the vertical diode 652 is less complicated to integrate into a transistor/diode configuration. In one embodiment, the transistor 655 and the vertical diode 652 operate at low-voltages (e.g., 5V) and form a portion of memory cell, an integrated circuit, or other suitable low-voltage device. In other embodiments, the transistor 655 and the vertical diode 652 operate at high-voltages (e.g., 50V) and form a portion of a power device.

Figure 7E:
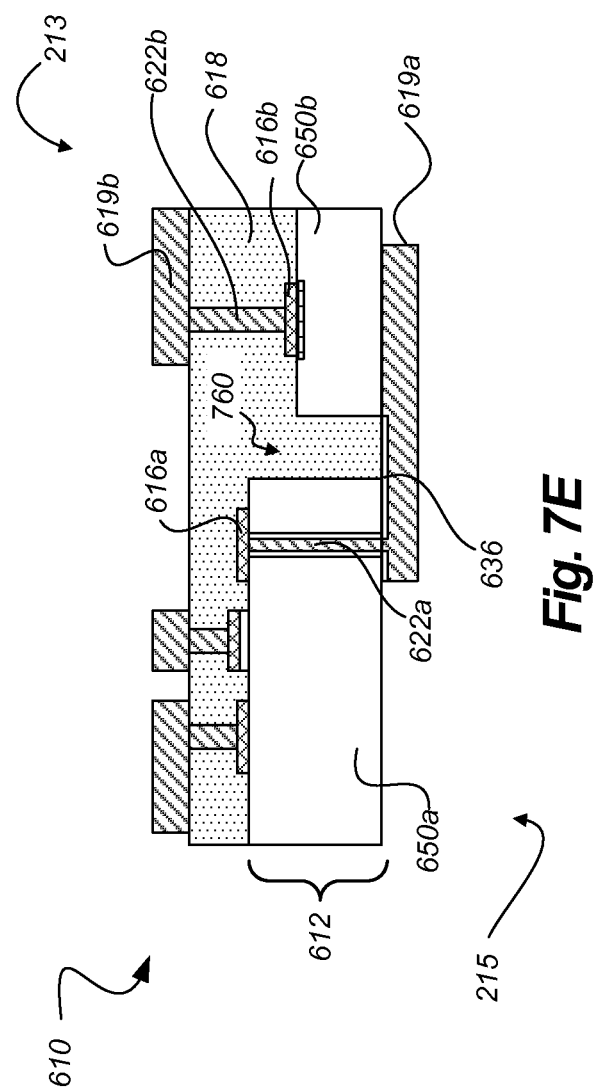

FIGS. 7A-7E are cross-sectional views illustrating a method of forming the semiconductor device 610 in accordance with selected embodiments of the present technology. FIG. 7A shows the semiconductor device 610 after forming the substrate regions 650. In particular, an opening 755 has been formed through the substrate 612 to mechanically separate the first substrate region 650a from the second substrate region 650b.

FIG. 7B shows the semiconductor device 610 after removing material from the second substrate region 650b and forming a contact region 756 in the substrate. As shown, the second substrate region 650b is thinned from a first level $L_1$ to a second level $L_2$ below the first substrate region 650a. In one embodiment, the second substrate region 650b is thinned to the second level $L_2$ to reduce electrical resistance through a bulk region 757 of the vertical diode 652 (FIG. 6). In another embodiment, however, the second substrate region 650b is not thinned because the second substrate region 650b may have negligible electrical resistance. For example, the substrate 612 may be so thin that the bulk region 757 has little or no electrical resistance. The contact region 756 can be configured to define a metal/semiconductor junction 653 having a silicide (e.g., palladium silicide or platinum silicide), an intrinsic (un-doped) semiconductor material, and/or a doped semiconductor material that alters the carrier concentration at the contact region 756 to form a suitable Schottky barrier with the second contact pad 616b (FIG. 6).

FIG. 7C shows the semiconductor device 610 after forming the dielectric material 618, the contact pads 616, the second through fourth interconnects 619b-d, the vias 622, and the gate element 630. As shown, a portion 760 of the dielectric material 618 extends between the substrate regions 650 to provide suitable electrical isolation. Also, the second contact pad 616b is formed on the contact region 756 (FIG. 7B) to define the metal/semiconductor junction 653. In some embodiments, the manufacturing processes to form the features of FIG. 7C can be similar to those described above with reference to FIGS. 5A-5E. However, in other embodiments, one or more of the processes can be different. For example, an opening in the substrate 612 for the first via 622a can be formed simultaneously with the opening 755 (FIG. 7A) between the substrate regions 650.

FIG. 7D shows the semiconductor device 610 after removing material at the second side 215 to expose portions of the first via 622a and the portion 760 of the dielectric material 618. In one embodiment, the manufacturing processes to form the features of FIG. 7D can be similar to those described above with reference to FIG. 5F. In other embodiments, however, the processes can be different. In one embodiment, for example, material can be removed at the second side 215 to also reduce electrical resistance through the bulk region 757 of the second substrate region 650b.

FIG. 7E shows the semiconductor device 220 after forming the first interconnect 619a and a dielectric liner 636 between a portion of the first interconnect 619a and the second substrate region 650b. Similar to FIG. 5G, the first interconnect 619a can be formed by depositing and patterning an interconnect material at the second side 215 of the substrate 612. Unlike FIG. 5G, however, the first interconnect 619a is deposited directly on the substrate 612 and the dielectric material 618. In some embodiments, the second substrate region 650b can be configured to form an Ohmic connection with the first interconnect 619a.

Figure 8:
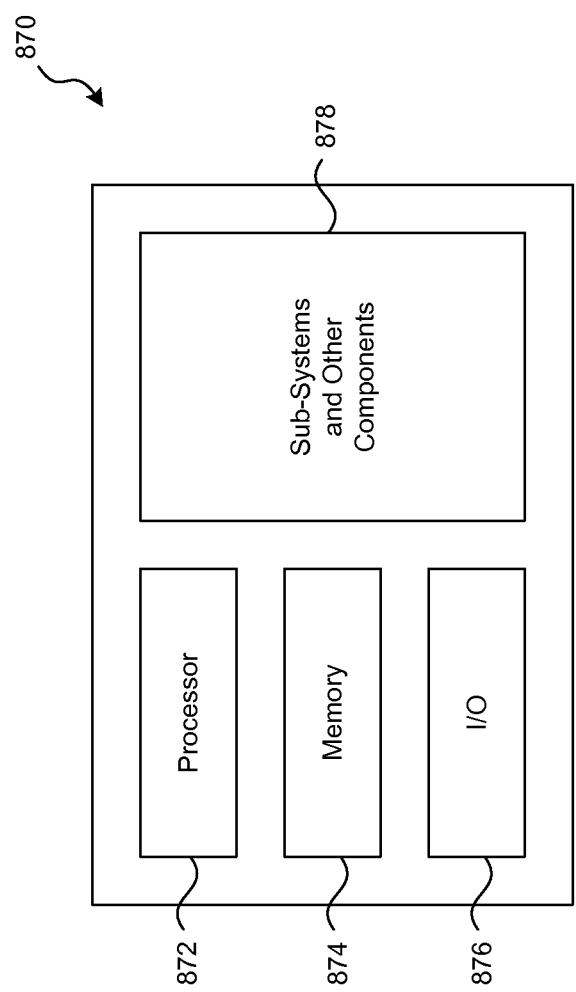
FIG. 8 is a block diagram illustrating a system that incorporates a semiconductor device in accordance with an embodiment of the present technology.

Any one of the semiconductor devices having the features described above with reference to FIGS. 2A-7E can be incorporated into any of a myriad of larger and/or more complex systems, a representative example of which is system 870 shown schematically in FIG. 8. The system 870 can include a processor 872, a memory 874 (e.g., SRAM, DRAM, flash, and/or other memory devices), input/output devices 876, and/or other subsystems or components 878. The resulting system 870 can be configured to perform any of a wide variety of suitable computing, processing, storage, sensing, imaging, and/or other functions. Accordingly, representative examples of the system 870 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 870 include lights, cameras, vehicles, etc. With regard to these and other examples, the system 870 can be housed in a single unit or distributed over multiple units, e.g., through a communication network. The components of the system 870 can accordingly include local and/or remote memory storage devices and any of a wide variety of suitable computer-readable media.

From the foregoing, it will be appreciated that specific embodiments of the disclosure have been described herein for purposes of illustration, but that various modifications may be made without deviating from the disclosure. For example, any of the first (through-substrate) vias can be formed without substrate thinning, but instead by etching a hole through one or both sides of the substrate. Also, the semiconductor devices, substrates, and other features can have shapes, sizes, and/or other characteristics different than those shown and described with reference to the Figures. In addition, certain aspects of the disclosure described in the context of particular embodiments may be combined or eliminated in other embodiments. For example, the diode shown in FIG. 6 may be combined with the transistor shown in FIGS. 3A-3C. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

We claim:

1. A semiconductor device, comprising:
   a substrate having a first side, a second side opposite the first side, and a source/drain region;
   an interconnect on the substrate at the second side; and
   first and second electrodes extending between the first and second sides, wherein—
     the first electrode includes—
       a first contact pad on the source/drain region, and
       a via extending through the substrate that connects the first contact pad with the interconnect, and
     the second electrode includes—
       a second contact pad on the substrate, and
       a conductive feature in the substrate that connects the second contact pad with the interconnect.

2. The semiconductor device of claim 1 wherein the via is a first via and the interconnect is a first interconnect, and wherein the semiconductor device further comprises:
   a dielectric material on the first and second contact pads;
   a second interconnect on the dielectric material; and
   a second via extending through the dielectric material that connects the second interconnect with the second contact pad.

3. The semiconductor device of claim 2 wherein the source/drain region is a first source drain region, and wherein:
   the substrate further includes a second source/drain region and a gate region between the first and second source/drain regions; and
   the semiconductor device further comprises—
     a third interconnect on the dielectric material,
     a third contact pad on the second source drain region; and
     a third via extending through the dielectric material that connects the third contact pad with the third interconnect.

4. The semiconductor device of claim 1 wherein the via is a first via, and wherein:
   the interconnect includes a first conductive plate; and
   the semiconductor device further comprises—
     a dielectric material on the first and second contact pads,
     a second conductive plate on the dielectric material, and
     a second via extending through the dielectric material that connects the second conductive plate with the second contact pad.

5. The semiconductor device of claim 1 wherein the via is a first via and the source/drain region is a first source/drain region, and wherein:
   the interconnect includes a first conductive plate; and
   the semiconductor device further comprises—
     a second conductive plate at the first side of the substrate, and
     a power transistor that includes the first source/drain region and a second source drain region connected to the second conductive plate.

6. The semiconductor device of claim 1 wherein the via is a first via, and wherein:
   the conductive feature includes a second via;
   the second electrode further includes a third via on the second contact pad; and
   the second contact pad connects the second via with the third via.

7. The semiconductor device of claim 1 wherein the conductive feature includes a vertical diode having a Schottky barrier defined between the second contact pad and the substrate.

8. The semiconductor device of claim 1 wherein the via extends through the source/drain region.

9. The semiconductor device of claim 1 wherein the interconnect includes a first conductive plate, and wherein the semiconductor device further comprises:
  a dielectric material on the first contact pad; and
  a second conductive plate on the dielectric material, wherein the source/drain region is between the first and second conductive plates.

10. The semiconductor device of claim 9 wherein the via is a first via and the source/drain region is a first source/drain region, wherein the substrate further includes second and third source/drain regions on opposite sides of the first source/drain region, and wherein the semiconductor device further comprises:
  a second via extending through the dielectric material that connects the second source/drain region to the second conductive plate; and
  a third via extending through the dielectric material that connects the third source/drain region to the second conductive plate.

11. A semiconductor device, comprising:
  a substrate having a first side, a second side opposite the first side, a first source/drain region, and a second source/drain region separate from the first source/drain region;
  a first conductive plate on the substrate at the second side;
  first and second electrodes extending between the first and second sides, wherein—
    the first electrode includes—
      a first contact pad on the first source/drain region, and
      a first via extending through the substrate that connects the first contact pad with the first conductive plate, and
    the second electrode includes—
      a second contact pad on the substrate, and
      a second via extending through the substrate that connects the second contact pad with the first conductive plate;
  a third contact pad on the second source/drain region;
  a dielectric material on the first and third contact pads;
  a second conductive plate on the dielectric material; and
  a third via extending through the dielectric material that connects the second conductive plate with the third contact pad.

12. The semiconductor device of claim 11, further comprising a power transistor that includes the first source/drain region and the second source/drain region.

* * * * *